United States Patent [19]
Budde

[11] 3,846,825
[45] Nov. 5, 1974

[54] SEMICONDUCTOR DEVICE HAVING CONDUCTING PINS AND COOLING MEMBER

[75] Inventor: Herman Budde, Emmasingel, Eindhoven, Netherlands

[73] Assignee: U.S. Philips Corporation, New York, N.Y.

[22] Filed: June 13, 1973

[21] Appl. No.: 370,476

Related U.S. Application Data

[63] Continuation of Ser. No. 219,479, Jan. 20, 1972, abandoned.

[30] Foreign Application Priority Data

Feb. 5, 1971 Netherlands ....................... 7101600

[52] U.S. Cl. ........................ 357/81, 357/80, 357/79, 357/68, 174/52 S

[51] Int. Cl. ............................ H01l 3/00, H01l 5/00

[58] Field of Search ................ 317/234, 1, 3, 3.1, 4, 317/4.1, 5, 5.4; 174/52 S, DIG. 3; 29/588

[56] References Cited

UNITED STATES PATENTS

| | | | |
|---|---|---|---|
| 3,361,868 | 1/1968 | Bachman | 317/234 A |
| 3,544,857 | 12/1970 | Byrne et al. | 317/234 G |
| 3,670,404 | 6/1972 | Kamoshida | 317/234 A |
| 3,748,726 | 7/1973 | Wiesner | 317/234 G |

OTHER PUBLICATIONS

IBM Technical Disclosure Bulletin, by Totta, Vol. 9, No. 11, April 1967, pages 1654 & 1655.

Film Plays Supporting Role, by Scrupski, Electronics, Feb. 1, 1971, pages 43–48.

*Primary Examiner*—Andrew J. James
*Attorney, Agent, or Firm*—Frank R. Trifari

[57] ABSTRACT

A semiconductor device comprising an insulating supporting plate which is provided on one of its surfaces with a pattern of metal conductors, of which one end is connected to current supply pins which extend at right angles to said surface and project from the supporting plate on the side of the conductors, and furthermore comprising a flexible insulating foil which is provided with a pattern of metal conductor tracks of which one end is connected to the contact places of a semiconductor body. The foil is present between the current supply pins with the semiconductor body and the conductor tracks facing the metal conductors, the ends of the conductor tracks remote from the semiconductor body being connected to the ends of the conductors remote from the current supply pins.

A cooling member may be provided which extends to against the rear side of the semiconductor body and which confers extra rigidity upon the device.

8 Claims, 11 Drawing Figures

SEMICONDUCTOR DEVICE HAVING CONDUCTING PINS AND COOLING MEMBER

Figure 1:
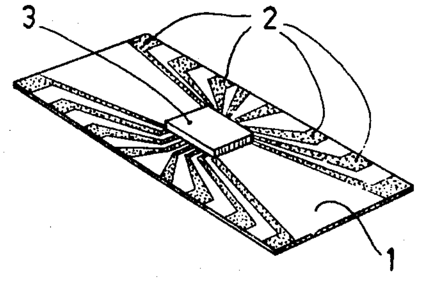

This is a continuation of application Ser. No. 219,479, filed Jan. 20, 1972 and now abandoned.

The invention relates to a semiconductor device comprising a semiconductor body of which contact places are connected to ends of metal conductor tracks which are provided on a flexible insulating foil of a synthetic material.

It is known to use during the manufacture of semiconductor devices insulating foils which are provided with semiconductor tracks. A large number of patterns of conductor tracks can be provided on such a foil after which, for example, a row of patterns is cut out of the foil and a semiconductor body is contacted on each pattern of conductor tracks. A part of the foil having a single pattern of conductor tracks on which a semiconductor body is secured can now be provided with rigid metal conductors and the assembly may be accommodated in an envelope of a synthetic material. Such a method of manufacturing can restrict the cost of production and yield a comparatively cheap product.

It is the object of the invention to provide a semiconductor device in which the foil with the semi-conductor body connected thereto is incorporated in a comparatively simple but sturdy and rigid housing which is suitable for being mounted in a printed circuit mounting panel and in which the cost of manufacture is minimized. In order to reach the end in view, according to the invention the semiconductor device comprises an insulating supporting plate which is provided on one of its major surfaces with a pattern of metal conductors, current supply pins being passed through the supporting plate, these current supply pins being in electric contact with ends of the conductors and projecting from the supporting plate mainly on the side of the conductors, the foil with the semiconductor body connected thereto being present between the current supply pins with the semiconductor body and the conductor tracks facing the metal conductors, the ends of the conductor tracks remote from the semiconductor body being connected electrically and mechanically to the ends of the conductors on the supporting plate remote from the current supply pins.

On one side the foil with the semiconductor body is screened by the supporting plate. On the other side the foil is protected from damage in that it is present between the current supply pins which are arranged, for example, in two rows. Prior to connecting the foil to the supporting plate, the semi-conductor body itself may be provided with a protective layer on its active side so that moisture and dirt of the surroundings cannot exert any adverse influence on its operation. The cost of said semiconductor device is very low without deteriorating its reliability.

In an embodiment according to the invention the supporting plate comprises an aperture in which the semiconductor body is present. In this case the foil may be arranged entirely flat against the supporting plate. The rear side of the semiconductor body may be protected, for example, by means of a cover of synthetic material provided in the aperture.

In a further embodiment according to the invention, a cooling member is connected to the supporting plate, said cooling member extending at least over a part of the major surface of the supporting plate remote from the pattern of conductors and comprising a projecting part which extends in the aperture of the supporting plate to against the rear side of the semiconductor body. This cooling member, the projection of which is connected, for example, in a thermally conductive manner and, possibly, in an electrically conductive manner to the rear side of the semiconductor body, permits, with this simple housing, a high power level to be evolved in the semiconductor body, large rises in temperature of the semiconductor body being prevented. The cooling member furthermore confers an extra rigidity on the semiconductor device and it protects the rear side of the crystal and the part of the foil which faces the aperture in the supporting plate.

In order to be able to insert the semiconductor body into apertures of a printed circuit mounting panel, in which the supporting plate yet remains at some distance from the mounting panel, the device may be provided with an abutment member extending in the direction of the current supply pins.

In a favourable embodiment according to the invention, the cooling member has a U-shape, the limbs of the U extending in the direction of the current supply pins and places of the limbs present beyond the supporting plate being forced through to below the supporting plate so as to connect the cooling member to the supporting plate. A very favourable heat dissipation is obtained, the supporting plate is particularly readily protected, and the lower edge of each of the limbs of the U may serve as an abutment in mounting the semiconductor device in an apertured mounting panel.

In another favourable embodiment, the supporting plate comprises at least two further apertures while the cooling member has at least two annular projections which are secured in the apertures of the supporting plate. In this case a simple and readily operating connection of the cooling member to the supporting plate is obtained.

A cooling member may furthermore comprise flanges which extend in a direction remote from the current supply pins. These flanges confer an extra cooling capacity on the semiconductor device. Furthermore, the of the cooling member may be small; a width maximum cooling member width equal to about the width of the supporting plate is favourable. In this case the semiconductor device, upon mounting on a mounting panel, occupies as little space as possible.

If an exceptionally large power is desired, a further cooling member provided with cooling ribs may be secured between the flanges of the cooling member. The base of the further cooling member may be secured between the flanges in a clamping manner.

In a further embodiment a current conductor which is connected both to the cooling plate and to one of the current supply pins is present on the side of the supporting plate remote from the pattern of conductors. As a result of this an electric connection of the cooling plate to one of the contact places of the semiconductor device is obtained.

In order to achieve this end, the cooling plate may also be provided with a lug which is bent towards the side of the foil on the supporting plate and the lug being connected to one of the conductor tracks of the foil or to one of the conductors of the supporting plate.

In order that the invention may be readily carried into effect, a few embodiments thereof will now be described in greater detail, by way of example, with reference to the accompanying drawings.

Figure 2:
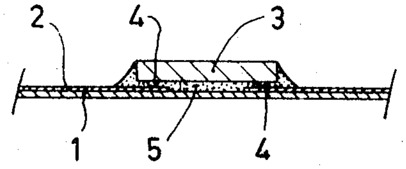
Figure 3:
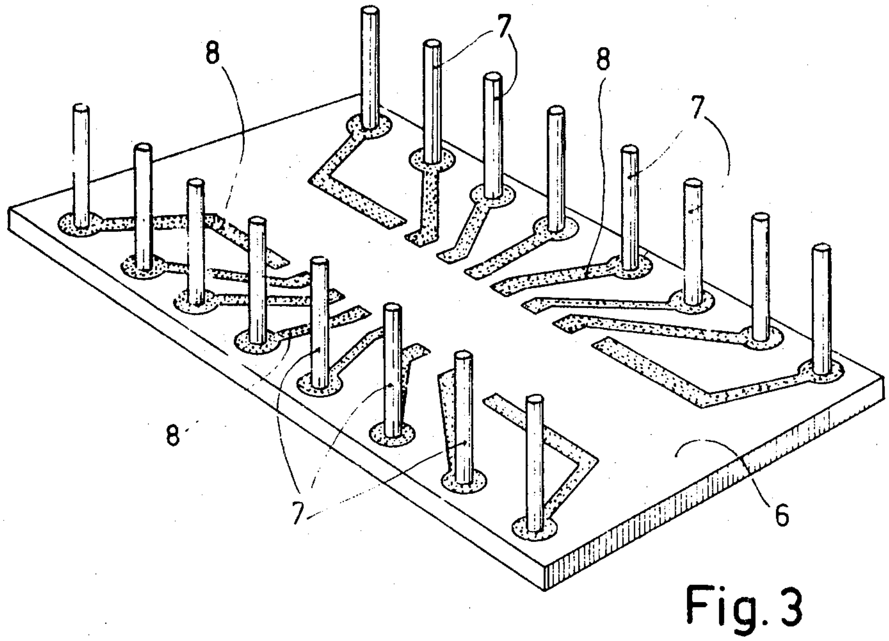

FIGS. 1 and 2, and 3 show a flexible foil part and a supporting plate, respectively, which foil part is to be secured to the supporting plate.

The foil 1 consists of a synthetic material which is electrically insulating and can withstand high temperatures, up to 450°C, for example a polyimide. It may have a thickness of, for example, 25 microns. A conductor pattern of metal tracks 2 is provided on the foil. This may be done by means of a photo-sensitive compound which after exposure to light is capable of supplying metal nuclei from a solution of metal salts, for example, mercurous salts, salts of silver, gold, platinum and palladium. This nuclei image may be intensified, for example, by electroless deposition of copper succeeded, if desirable, by electro-deposition. The pattern of metal tracks may also be obtained in a different manner, for example, by vapour deposition of a layer of the desirable metal on the foil, the places not to be metallized being removed by etching by means of a photo-etching method. It will be obvious that the foil part shown is preferably obtained by cutting it out of a large foil on which the conductor tracks 2 are arranged in rows and columns.

A disk-shaped semiconductor body 3 which comprises, for example, an integrated circuit is connected to the foil 1. The semiconductor body is provided with metal contact places 4 which project slightly above the disk surface, which contact places 4 are joined, e.g., soldered or welded ultrasonically, to the inner ends of the metal tracks 2. The active side of the semiconductor body which faces the foil is preferably covered with a passivating agent 5. For that purpose, there is used, preferably, a solvent-free mixture of an amino-alkyl silane with an organic epoxy compound, which has an excellent passivating effect, is very thin liquid prior to hardening and as a result of this is drawn by capillary action into the gap between the foil and the semiconductor body (which gap is a few microns wide) and, in addition, has the particularly favourable property of acting as an excellent adhesive after hardening. A very good adhesion is thus obtained between the semiconductor body 3 and the foil 1, preventing moisture and dirt from penetrating to the active side of the semiconductor body. If desirable, the semiconductor body may be covered with a passivating glass layer; the provision of the passivating agent also has great advantages due to the good adhesive action.

A supporting plate 6 (FIG. 3) is manufactured from an insulating material and may consist, for example, of hard paper or a ceramic material. Current supply pins 7 are passed through the supporting plate 6 and project from the supporting plate on one side. On that side the surface of the supporting plate 6 is provided with metal conductors 8 which may consist, for example, of a layer of copper, 25 $\mu$ thick, which is covered with a thin readily solderable metal layer, for example lead tin or nickel-gold. At one end thereof, the conductors 8 are connected electrically to the current supply pins 7, for example by means of solder. Their other ends are arranged in a pattern which corresponds to the ends of the metal tracks 2 on the insulating foil 1 remote from the semiconductor body 3.

The foil 1 with the semiconductor body 3 is then provided on the supporting plate 6, the foil being present between the current supply pins 7, with the semiconductor body 3 and the conductor tracks 2 facing the surface of the supporting plate provided with the conductors 8. The ends of the conductor tracks 2 and the metal conductors 8 lying one on the other are soldered together.

Figure 4:
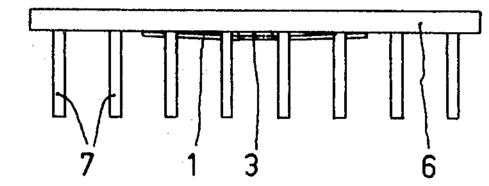

The resulting semiconductor device, of which FIG. 4 shows an elevation, is ready for use. It is very simple in construction, can be mass-produced and provides sufficient protection of the semiconductor body 3 and the foil. The foil with the semiconductor body present between the current supply pins 7 is protected from damage by the pins. Dirt and moisture cannot reach the semiconductor body as a result of the passivating layer. The current supply pins may be placed so that the semiconductor device can be secured in apertures of a printed circuit mounting panel.

Figure 5:
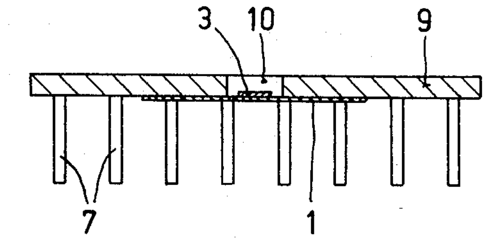

FIG. 5 shows a similar semiconductor device in which, however, a continuous aperture 10 is present in the center of the supporting plate 9. In this case the semiconductor body 3 does not engage the supporting plate with its rear side but falls in the aperture 10. In this manner the foil 1 is not stretched and curved but bears flat against the supporting plate. In order to protect the rear side of the semiconductor body, the aperture 10 may be filled, for example, with a protective synthetic material.

Figure 6:
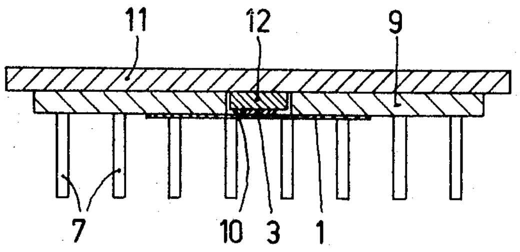

FIG. 6 shows a construction similar to that of FIG. 5. In this embodiment, however, a cooling plate 11 is provided which extends over the surface of the supporting plate 9 remote from the current supply pins 7. The cooling plate 11 comprises a projection 12 which extends to against the rear side of the semiconductor body and is preferably secured thereto, for example, by means of a heat conductive connection and possibly an electrically conductive connection, for example, a glue or solder. The cooling plate 11 may be connected to the supporting plate 9 in any manner, for example by means of a glue. It may also be soldered to a metal surface arranged on the upper side of the supporting plate. This cooling plate which normally consists of aluminum or copper confers a greater rigidity upon the device while the power evolved in the semiconductor body can be considerably higher than without the use of cooling means.

Figure 7:
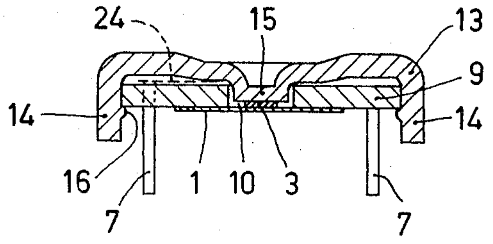

FIG. 7 shows a favourable embodiment of the semiconductor device. In this embodiment a supporting plate 9 having an aperture 10 is present in which the semiconductor body 3 falls. The cooling plate 13 mainly has a substantially U-shaped construction. The limbs 14 of the cooling plate are bent in the direction of the current supply pins 7 and extend to slightly below the supporting plate 9. In the part of the cooling plate present against the upper side of the supporting plate, a recessed part 15 is provided which extends to against the semiconductor body 3. This recessed part may again be connected to the semiconductor body in a heat-conducting manner and possibly in an electrically conducting manner. In some places present below the supporting plate 9, the limbs 14 are slightly depressed as a result of which projections 16 are formed so that the cooling plate 13 is rigidly connected to the supporting plate 9. The cooling plate thus formed has a very large cooling capacity. In addition it constitutes a excellent protective cap for the supporting plate with the foil secured thereto and confers a particularly large rigidity upon the semiconductor device. The lower ends of the limbs 14 may serve as abutments in mounting the device in apertures of a mounting panel so that the lower side of the supporting plate and the foil cannot press against the mounting panel.

Figures 8, 9:
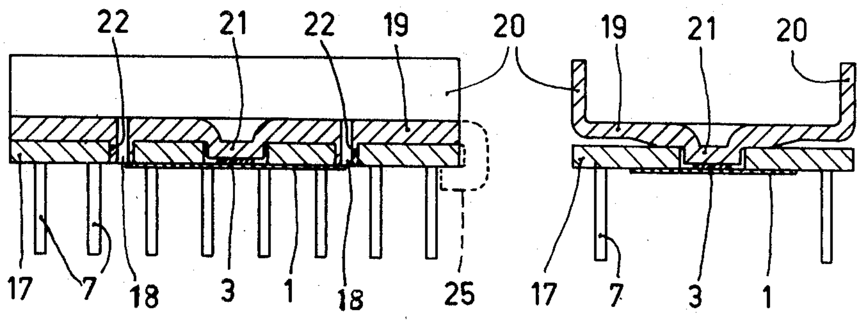

FIGS. 8 and 9 show another embodiment of a semiconductor device having a very favourably operating cooling plate. The supporting plate 17 in this embodiment comprises two further apertures 18 which preferably are circular. The cooling plate 19 is again constructed substantially in the form of a U. In this case, however, the limbs 20 are directed upwards. The cooling plate again has a forced-through part which is denoted by 21. This part 21 extends to against the semiconductor body 3 and is secured thereto in a heat conducting and possibly electrically conductive manner. The cooling plate comprises two annular projections 22. The connection of the cooling plate to the supporting plate is preferably carried out by flanging the annular projections 22 in the apertures 18 of the supporting plate. When using the cooling plate 19 it is possible to obtain a semiconductor device having an equally favourable cooling capacity as in the embodiment shown in FIG. 7, while the width of the semiconductor device nevertheless can be smaller since the limbs 20 do not project beyond the supporting plate 17.

Figure 10:
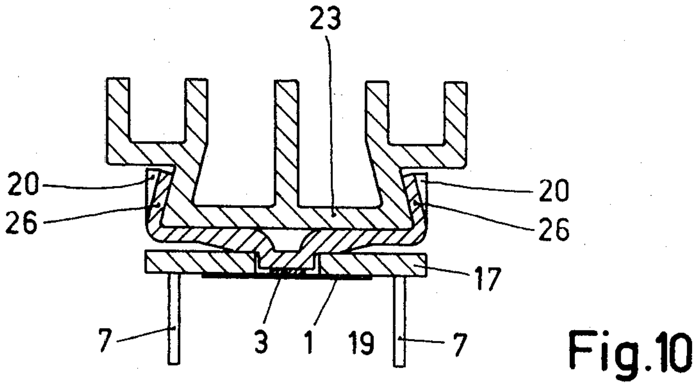

In order to achieve an extremely large cooling capacity, an extra cooling member 23 may be used as is shown in FIG. 10. The base of a cooling member 23 provided with cooling ribs is arranged between the limbs 20 of the cooling plate 19. This cooling member may consist, for example, of aluminium and can be manufactured in a simple manner by means of extrusion. It may be secured in the cooling plate 19, for example in a clamping manner, in that parts of the limbs 20 are pressed against the base of the cooling member 23.

It may be desirable that there exist an electric connection between the cooling plate and one of the contact places of the semiconductor body. This can be realised in various manners. For example, on the side of the supporting plate 9 (FIG. 7) present opposite to the pattern of conductors 8, a conductor 24 (shown in broken lines in FIG. 7) may be provided which is connected, e.g., by means of soldering, both to the cooling plate and to a conductor pin.

It is also possible to provide a cooling plate with a lug which is denoted, by way of example, in broken lines by 25 in FIG. 8. This lug 25 is connected to one of the conductors 8 on the supporting plate 17. The lug may also be constructed so that one of the conductor tracks of the foil 1 is secured thereto.

Figure 11:
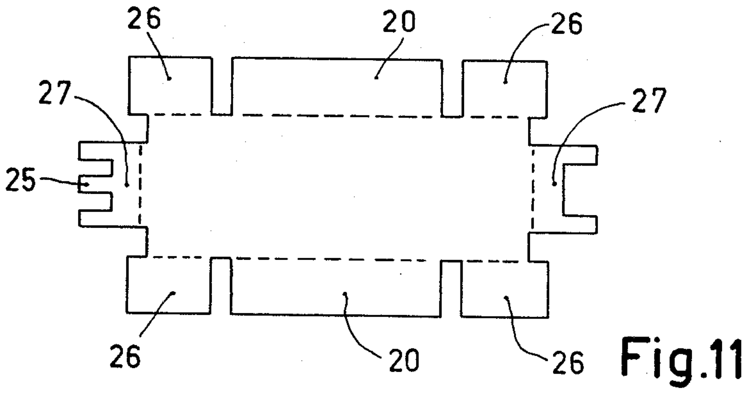

FIG. 11 is a developed view of a cooling plate which may be used, for example, in a semiconductor device of the type shown in FIGS. 8 to 10. The limbs 20 are bent upwards (as shown in FIG. 10). The parts 26 serve to be pressed against the extra cooling member 23 and to clamp this. The projections 27 are bent downwards in the direction of the current supply pins and constitute an abutment upon mounting the semiconductor device in a mounting panel. The lug 25 is bent in the manner shown in FIG. 8 and connected in an electrically conductive manner to one of the conductors of the supporting plate or to one of the conductor tracks of the foil.

What is claimed is:

1. A semiconductor device comprising:

a. an electrically insulating support plate having oppositely disposed first and second major surfaces, said plate comprising an aperture;
b. a pattern of metal conductors disposed completely at said first major surface;
c. current supply pins mounted on said support plate and having at least one thereof extending completely therethrough so as to be accessible from said second surface, said pins projecting orthogonally in the same direction from said first major surface, said pins being electrically and mechanically connected directly to respective parts of said metal conductors and extending a substantial distance from said first major surface so as to be available for making external electrical connections to said metal conductors;
d. a semiconductor body comprising contact places, said semiconductor body being disposed in said plate aperture;
e. a flexible electrically insulating foil of synthetic material;
f. metal conductor tracks disposed on a first foil face and individually defining proximate and distal end portions, said distal end portions being spaced closer to the periphery of said foil, said semiconductor body being mounted on said foil with its contact places being disposed on and in electrical contact with respective proximate end portions of said metal conductor tracks, said foil being disposed on said first major surface and lying wholly between the pins with the distal end portions being disposed on and in electrical contact with respective ones of said metal conductors and with the body being spaced from said second major surface, whereby said external electrical connections are made to said body and the opposite face of said foil is in overlying protective relationship to the body; and
g. a cooling member connected to said support plate, said cooling member extending over at least a part of said second major surface of said support plate and comprising a projecting part which extends into said aperture of said support plate and engages the rear side of the semiconductor body in thermally conductive fashion.

2. A semiconductor device as recited in claim 1, further comprising an abutment extending in the same direction as said current supply pins.

3. A semiconductor device as recited in claim 1, wherein said cooling member is substantially U-shaped and comprises limbs extending in the same direction as said current supply pins, portions of said limbs being deformed to engage said first surface of said supporting plate so as to connect said cooling member to said support plate.

4. A semiconductor device as recited in claim 1, wherein said support plate comprises at least two further apertures and said cooling member has at least two annular projections which are secured in said further apertures of the supporting plate.

5. A semiconductor device as recited in claim 1, wherein said cooling member comprises flanges which extend in a second direction different from that of said current supply pins.

6. A semiconductor device as recited in claim 5, further comprising a second cooling member provided with cooling ribs and connected between the flanges of said first cooling member.

7. A semiconductor device as recited in claim 1, further comprising a current conductor located at said second major surface of said support plate and electrically connected both to the cooling member and to said one of the current supply pins.

8. A semiconductor device as recited in claim 1, wherein said cooling plate comprises a lug which is bent to the lower side of the support plate and is connected there to one of a conductor tracks of said foil and a metal conductor of said support plate.

* * * * *